(12) United States Patent
Li et al.

(10) Patent No.: US 10,366,946 B2
(45) Date of Patent: Jul. 30, 2019

(54) CONNECTION MEMBER WITH BULK BODY AND ELECTRICALLY AND THERMALLY CONDUCTIVE COATING

(71) Applicant: Infineon Technologies AG, Neubiberg (DE)

(72) Inventors: Wu Hu Li, Singapore (SG); Edmund Riedl, Wald (DE); Thomas Horedt, Haar (DE); Ali Mazloum-Nejadari, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/797,297

(22) Filed: Oct. 30, 2017

(65) Prior Publication Data
US 2019/0131218 A1    May 2, 2019

(51) Int. Cl.
*H01L 23/495* (2006.01)
*H01L 21/48* (2006.01)
(Continued)

(52) U.S. Cl.
CPC .... *H01L 23/49568* (2013.01); *H01L 21/4821* (2013.01); *H01L 23/14* (2013.01); *H01L 23/3107* (2013.01); *H01L 23/49582* (2013.01); *H01L 24/32* (2013.01); *H01L 24/35* (2013.01); *H01L 24/40* (2013.01); *H01L 24/83* (2013.01); *H01L 23/3675* (2013.01); *H01L 24/37* (2013.01); *H01L 24/48* (2013.01); *H01L 24/73* (2013.01); *H01L 24/84* (2013.01); *H01L 2224/32245* (2013.01); *H01L 2224/3512* (2013.01); *H01L 2224/3716* (2013.01); *H01L 2224/37572* (2013.01); *H01L 2224/37611* (2013.01); *H01L 2224/37616* (2013.01); *H01L 2224/37618* (2013.01); *H01L 2224/37639* (2013.01); *H01L 2224/37644* (2013.01);
(Continued)

(58) Field of Classification Search
CPC ......... H01L 23/49568; H01L 23/49582; H02L 23/49822
See application file for complete search history.

(56) References Cited

U.S. PATENT DOCUMENTS

| 6,281,568 B1 | 8/2001 | Glenn et al. |
| 7,221,042 B2 | 5/2007 | Bambridge |

(Continued)

FOREIGN PATENT DOCUMENTS

| CN | 100490139 C | 5/2009 |
| EP | 0538019 A2 | 4/1993 |
| JP | 62213269 A | 9/1987 |
| WO | 2007079125 A2 | 7/2007 |

OTHER PUBLICATIONS

English language translation of the Abstract and published claims for CN 100490139.
English language Abstract for JP 62213269.

*Primary Examiner* — Quoc D Hoang

(57) ABSTRACT

A connection member for connecting an electronic chip, wherein the connection member comprises a bulk body, and a coating at least partially coating the bulk body and comprising a material having higher electric and higher thermal conductivity than the bulk body, wherein a ratio between a thickness of the coating and a thickness of the bulk body is at least 0.0016 at at least a part of the connection member.

20 Claims, 4 Drawing Sheets

(51) Int. Cl.
  *H01L 23/14* (2006.01)
  *H01L 23/31* (2006.01)
  *H01L 23/00* (2006.01)
  *H01L 23/367* (2006.01)

(52) U.S. Cl.
  CPC ............... *H01L 2224/37647* (2013.01); *H01L 2224/37655* (2013.01); *H01L 2224/37664* (2013.01); *H01L 2224/40175* (2013.01); *H01L 2224/48245* (2013.01); *H01L 2224/73263* (2013.01); *H01L 2224/73265* (2013.01); *H01L 2924/13055* (2013.01); *H01L 2924/13062* (2013.01); *H01L 2924/13091* (2013.01); *H01L 2924/2064* (2013.01); *H01L 2924/20641* (2013.01)

(56) References Cited

U.S. PATENT DOCUMENTS

| | | | |
|---|---|---|---|
| 7,847,392 | B1 | 12/2010 | Choi et al. |
| 8,133,763 | B2 * | 3/2012 | Koduri ............... H01L 21/4842 438/111 |
| 8,188,579 | B1 | 5/2012 | Kim et al. |
| 8,395,246 | B2 | 3/2013 | Yu et al. |
| 8,410,585 | B2 | 4/2013 | Ahn et al. |
| 8,737,089 | B2 | 5/2014 | Semcer, Sr. et al. |
| 9,263,440 | B2 | 2/2016 | Otremba et al. |
| 9,947,606 | B2 * | 4/2018 | Huang ............... H01L 23/3135 |
| 2008/0054420 | A1 | 3/2008 | Quah et al. |
| 2012/0075828 | A1 | 3/2012 | Semcer, Sr. et al. |
| 2014/0239471 | A1 | 8/2014 | Khunpukdee et al. |
| 2016/0315033 | A1 | 10/2016 | Otremba et al. |

* cited by examiner

CONNECTION MEMBER WITH BULK BODY AND ELECTRICALLY AND THERMALLY CONDUCTIVE COATING

TECHNICAL FIELD

Various embodiments relate generally to a connection member, a method of manufacturing a connection member, an electronic component, and a method of manufacturing an electronic component.

BACKGROUND

Conventional encapsulant materials, such as mold structures, for electronic chips have evolved to a level where the package no longer significantly impedes the performance of the chip or chips. Encapsulating electronic components during package manufacture may protect them against the environment. It is also common to use non-encapsulated packages or even naked dies for various electronic applications. In packages, a bottom of an electronic chip may be mounted on a chip carrier such as a leadframe. A top of the electronic chip may be connected by a bond wire or a clip.

However, there is still potentially room to reduce manufacturing cost and simplify processing while ensuring a high heat removal capability of removing heat generated during operation of the electronic chip. At the same time, a proper electric performance is desired.

SUMMARY

According to an exemplary embodiment, a connection member for connecting an electronic chip is provided, wherein the connection member comprises a bulk body (for instance comprising iron), and a coating at least partially coating the bulk body and comprising a material having higher electric and thermal conductivity than the bulk body, wherein a ratio between a thickness of the coating and a thickness of the bulk body is at least 0.0016 at or over at least a part of the connection member.

This may enable a simple connection of an electronic chip with low electric loss and efficient heat removal.

According to another exemplary embodiment, a method of manufacturing a connection member for connecting an electronic chip is provided, wherein the method comprises providing a bulk body comprising iron, at least partially coating the bulk body by a coating comprising copper, and forming at least a portion of the coating with a thickness of above 4 µm and not more than 100 µm.

According to another exemplary embodiment, an electronic component is provided, wherein the electronic component comprises a leadframe comprising a bulk body at least partially coated with a coating comprising copper, the coating having a thickness of more than 4 µm, and an electronic chip coupled with the leadframe.

According to another exemplary embodiment, a method of manufacturing an electronic component is provided, wherein the method comprises providing a leadframe with a non-copper bulk body (i.e. a bulk body made from another material than copper) at least partially coated with a coating comprising copper (for instance copper or a copper alloy) or zinc (for instance zinc or a zinc alloy) and having a thickness of more than 4 µm, and coupling an electronic chip with the leadframe.

According to an exemplary embodiment, a connection member is provided which can be produced with a simple and efficient manufacturing process and nevertheless shows very good electric and thermal performance. Such a connection member can be manufactured based on a simple bulk body material (preferably comprising iron) and includes a coating with a higher thermal conductivity and a higher electrical conductivity than the bulk body material (preferably copper). As a result, the connection member as a whole is perfectly appropriate for implementation in power packages and nevertheless can be manufactured simply and quickly. Such a power package, as an example for an electronic component using such a connection member, may employ the described connection member for mounting an electronic chip thereon. This will allow providing a low ohmic electric coupling as well as an efficient heat removal during operation of the electronic component.

In particular, it has turned out that a thickness of at least 4 µm of the coating is highly advantageous to provide a sufficient thermal and electric performance for power package applications. Correspondingly, it is advantageous that a thickness ratio between coating and bulk body should be at least 0.0016 to obtain a pronounced overall thermal and electrical conductivity.

DESCRIPTION OF FURTHER EXEMPLARY EMBODIMENTS

In the following, further exemplary embodiments of the connection member, the electronic component, and the methods will be explained.

In the context of the present application, the term "connection member" may in particular denote an at least partially electrically conductive and at least partially thermally conductive member which is provided for establishing an electric and a thermal connection with an electronic chip. Non-exhaustive examples for such a connection member are chip carriers such as leadframes, or connection elements such as clips. Connection members or elements may include further examples which are apparent to a skilled person in the art.

In the context of the present application, the term "leadframe" may particularly denote a preferred example of a chip carrier being configured as a sheet-like metallic structure which can be punched or patterned so as to form leadframe bodies as mounting sections for mounting the chips, and connection leads as pin sections for electric connection of the package to an electronic environment when the chips are mounted on the leadframe. In an embodiment, the leadframe may be a metallic plate which may be patterned, for instance by stamping or etching. Forming the chip carrier as a leadframe is a cost-efficient and mechanically as well as electrically highly advantageous configuration in which a low ohmic connection of the chips can be combined with a robust support capability of the leadframe. Furthermore, a leadframe may contribute to the thermal conductivity of the package and may remove heat generated during operation of the chip(s) as a result of the high thermal conductivity of at least part of the metallic material of the leadframe.

In the context of the present application, the term "clip" may particularly denote a curved connection element which comprises an electrically conductive material and is an integral body with sections to be connected to chip terminals and/or the chip carrier. In particular, the clip may have a (for instance generally flat) major portion and a curved lead portion (which may extend downwards or upwards from the major portion).

In the context of the present application, the term "electronic component" may in particular denote any member or device implementing at least one electronic chip which generates heat during operation.

In the context of the present application, the term "electronic chip" may in particular denote a naked die or an encapsulated semiconductor chip fulfilling an electronic function. The electronic chip may also form part of a still integrally connected wafer, i.e. may be a section of a wafer. For instance, the electronic chip is a semiconductor chip, in particular a power semiconductor chip.

In the context of the present application, the term "bulk body" may in particular denote a rigid base constituting the majority of the material of the connection member as a whole. Such a bulk body may be a plate or sheet.

In the context of the present application, the term "coating" may in particular denote a thin film or a layer or a stack of layers applied on an exterior surface of the bulk body or a part thereof. The coating may have a uniform or substantially uniform thickness. The thickness of the coating may be significantly lower than the thickness of the bulk body.

In an exemplary embodiment, it is proposed to use an iron-based bulk body (for instance made of steel or steel-alloy as leadframe bulk material) with a coating (which may preferably comprise copper or copper alloy as a metallization layer) to improve the electrical and thermal performance of the leadframe rendering the connection member and corresponding electronic component highly appropriate for power packages or power device applications (in particular vertical current flow devices). This suitability may be obtained due to the provision of a highly electrically conductive and highly thermally conductive (preferably copper or copper-based) metallization covering the base material. Thus, an exemplary embodiment provides a connection member in form of an iron-based, in particular a steel-based, leadframe core with a copper-based coating thereon. Such a connection member may be advantageously used for a power package (as an example for an electronic component).

In particular, it turned out to be advantageous that a ratio of thicknesses between a (in particular copper) coating and a (in particular steel) bulk body is at least 0.0016, in particular at least 0.016, more particularly 0.03, still more particularly at least 0.05. Advantageously, the thickness of the copper coating should be at least 4 µm, whereas the thickness of the bulk body is preferably at least 100 µm, in particular at least 250 µm. An upper limit of the mentioned ratio is, in an embodiment, 0.4, preferably 0.2.

In an embodiment, the ratio of coating layer thickness to bulk body thickness is at least 0.016. The value 0.016 is derived from 4 µm/250 µm for TDSON 8. However, this ratio may change and may also depend on the bulk material thickness. For TO dual gauge leadframe for instance, this ratio may be much smaller, such as 4 µm/500 µm=0.008 and 4 µm/1270 µm=0.00315. Some examples are given in the following:

| coating layer thickness min (µm) | Bulk thickness (µm) | Coating/Bulk ratio |
|---|---|---|
| 4 | 100 | 0.0400 |
| 4 | 250 | 0.0160 |
| 4 | 500 | 0.0080 |
| 4 | 1270 | 0.0031 |
| 4 | 2500 | 0.0016 |

An advantageous combination according to an exemplary embodiment is the provision of a leadframe core as bulk body coated with one or more plating layers and a semiconductor die as electronic chip on or above the leadframe. Preferably, copper may be used as a plating material, more preferably with a thickness of more than 4 µm. Preferably, the die or electronic chip may be configured as a device with vertical current flow and may be attached using a die attach material (for instance a solder, such as a diffusion solder, or an epoxy material). In such an embodiment, the coating may also comprise a solder plating.

According to yet another exemplary embodiment, the electronic component may be configured as a package with exposed electric contacts and with an encapsulated electronic chip (for instance using a mold compound for encapsulation). For example, a package may be provided having a bottom at which a chip carrier (such as a leadframe) is not or is not completely covered by an encapsulant such as a mold compound.

In an embodiment, at least a portion of the coating has a thickness in a range between 4 µm and 100 µm, in particular in a range between 7 µm and 50 µm, more particularly in a range between 10 µm and 30 µm. Coatings of such thicknesses may ensure both a high thermal and electrical performance of the corresponding electronic component and may be manufactured with reasonable effort. If the thickness becomes too small, the electrical and thermal conductivity of the coating may become too small for power package applications. If the thickness becomes too large, the plating process used for forming the coating on the bulk body will take too much time for an efficient manufacturing.

In an embodiment, the connection member is configured as a leadframe. A leadframe manufactured on the basis of a cheap and simple bulk body in combination with an efficiently manufacturable coating for improving thermal and electric performance has turned out as highly advantageous, in particular for semiconductor power applications. The electronic chip may be mounted on the leadframe, and the leadframe may also establish external electric connections of the electronic component (in particular when the one or more electronic chips thereof are encapsulated).

In another embodiment, the connection member is configured as a clip. The combination of a simple and cheap bulk body with a thermally and electrically highly conductive coating renders a corresponding clip highly appropriate for establishing a low-ohmic and heat dissipating connection between a main surface of an electronic chip and another electronic member such as a chip carrier (like a leadframe).

In an embodiment, a thickness of the bulk body is in a range between 100 µm and 2500 µm, in particular in a range between 200 µm and 600 µm. A length and/or a width of the bulk body may be significantly larger than the thickness thereof, for instance may be at least five times of the thickness, more particularly may be at least ten times of the thickness. In particular, the bulk body may be a plate shaped or sheet shaped element which may be planar (for instance flat) or curved (for instance bent).

In an embodiment, the bulk body comprises or consists of one of iron, an iron alloy, a steel alloy, and steel (in particular at least one of carbon steel, alloy steel, stainless steel, and tool steel). The iron included in each and every of these materials provides a stable and stiff base while at the same time providing at least some electrical and thermal conductivity which can be further improved by the coating.

In an embodiment, the coating comprises copper and/or zinc. Both these materials have higher electrical and thermal conductivity than iron or steel. Especially preferred is the use of copper providing a very pronounced improvement in terms of thermal and electrical connectivity, being manufacturable in a simple and reliable way, and providing a proper mechanical interface between the connection member and a further member to be connected with it (such as the electronic chip, or a mounting base such as a printed circuit board). In particular, a coating comprising copper may consist of copper or may comprise a copper alloy (such as CuZn and/or CuSn).

Reasons to apply a metal layer (in particular Cu or Zn) are to enhance the shell-conductivity of the leadframe in the device, but also to enhance interconnect possibilities. For instance, soldering on Cu is possible, and soldering on Zn is also possible. Hence, Zn may enable a surface that can be soldered and is corrosion inhibiting.

In an embodiment, the connection member comprises at least one further coating on at least part of the coating. Thus, at least part of the coating may be coated by a further coating. The further coating and the coating may be made of different materials. The further coating may form part of an exterior surface of the connection member or the electronic component. In other words, the bulk body may be covered by a stack of multiple layers. The lowermost layer applied directly on the bulk body may serve for improving electric and thermal performance, whereas one or more upper layers on this coating may serve for instance for another purpose. This purpose may be the capability of the surface of the connection member to be connected with another member, for instance with a bond wire or a component connected to the connection member (for instance by soldering). This capability may be improved or promoted by an additional coating.

For instance, the at least one further coating may comprise Ag (for promoting wire bonding, in particular with a bond wire comprising gold and/or copper), Ni or Ni/NiP (both for promoting wire bonding with aluminum wires), Ni/NiP/Ag (for promoting wire bonding with certain materials), Ni/Pd/Au—Ag or Ni/Pd/Au—Pd or Ni/Pd/Au (each promoting wire bonding, in particular with a bond wire comprising gold and/or copper), and Sn or Sn—Pb (for providing a solderable surface of a portion of the connection member extending beyond an encapsulant of a package-type electronic component, for instance for mounting the electronic component on a mounting base such as the PCB). However, other types of multilayer coatings are possible depending on a desired application.

In yet another embodiment, there is no further coating on the coating comprising copper or a copper alloy.

In an embodiment, the coating is applied directly on the bulk body. In particular, a coating of copper properly adheres directly on an iron comprising bulk body. However, in other embodiments, at least one further layer may be arranged between the bulk body and the coating, for instance an adhesion promoting layer.

In an embodiment, the coating coats the entire surface of the bulk body. This allows a simple manufacturability of the connection member, since there is no need to prevent or remove a coating on certain surface portions of the bulk body. However, it is alternatively also possible that portions of the bulk body remain uncovered from a coating. If for instance a coating of a connection member is formed after encapsulating the chip and part of the connection member with an encapsulant, even an unspecific coating process will only act on an exposed surface portion of the connection member.

In an embodiment, forming the coating comprises at least one of the group consisting of plating (in particular one of electroplating and electroless plating), physical vapor deposition, chemical vapor deposition, rolling of one or more copper comprising sheets onto the bulk body, and sputtering. It is preferred to apply the coating by plating. In particular, copper plating on an iron comprising bulk body (preferably on steel) has turned out to be simple, quick and can be accomplished without the risk of delamination between the coating and the bulk body.

In an embodiment, the electronic component is configured as a power package. Correspondingly, the electronic chip may be is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide). A semiconductor power chip may comprise one or more field effect transistors, diodes, inverter circuits, half-bridges, full-bridges, drivers, logic circuits, further devices, etc.

In an embodiment, the electronic chip is configured for an operation with a vertical current flow. Hence, the electronic chip may experience a vertical current flow during operation of the package-type electronic component. The package architecture according to exemplary embodiments of the invention is particularly appropriate for high power applications in which a vertical current flow is desired, i.e. a current flow in a direction perpendicular to the two opposing main surfaces of the electronic chip, one of which being used for mounting the electronic chip on the chip carrier.

In an embodiment, the electronic component comprises an encapsulant, in particular a mold compound, encapsulating part of the connection member (in particular a leadframe or a clip) and the electronic chip. For example, the encapsulant is selected from a group consisting of a mold compound, and a laminate. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity, may be embedded in an epoxy-based matrix of the encapsulant.

For instance, a portion of the leadframe extending beyond the encapsulant may comprise a further coating (for instance of Sn or SnPb) on the coating, wherein this further coating is not formed on another portion of the leadframe being encapsulated by the encapsulant. Such a further coating may make it possible to connect the exposed portion of the leadframe with a mounting base by soldering. It is also possible to configure the further coating as a material allowing a sinter connection between the exposed portion of the leadframe and a mounting base.

In an embodiment, the electronic chip is mounted on the leadframe, for instance by forming a solder connection between the electronic chip and the leadframe. Alternatively, a sinter or a gluing connection may be established.

Exemplary embodiments are compatible with very different package architectures: In an embodiment, the electronic component is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin Small Outline Package (TSOP) electronic component. Therefore, the electronic component according to an exemplary embodiment is fully compatible with standard packaging concepts (in particular fully compatible with standard TO packaging concepts) and appears externally as a conventional electronic component, which is highly user-convenient. In an embodiment, the electronic component is configured as power module, for instance molded power module. For instance, an exemplary embodiment of the electronic component may be an intelligent power module (IPM). Another exemplary embodiment of the electronic component is a dual inline package (dip).

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
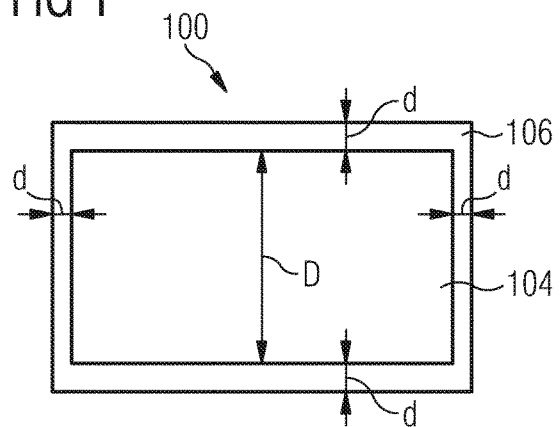
FIG. 1 schematically illustrates a cross-sectional view of a connection member according to an exemplary embodiment in which a bulk body of steel is coated with a copper coating.

The illustration in the drawing is schematically and not to scale.

FIG. 1 schematically illustrates a cross-sectional view of a connection member 100 (such as a leadframe or a clip) according to an exemplary embodiment in which a bulk body 104 of steel is directly coated with a copper coating 106.

The connection member 100 is provided for electrically, mechanically and thermally connecting an electronic chip 102 in various applications (see for instance FIG. 9 to FIG. 13). As can be taken from FIG. 1, the entire surface of the steel bulk body 104 is covered with copper coating 106 so that copper material forms the entire exterior surface of the connection member 100 in the embodiment according to FIG. 1. In other words, the steel bulk body 104 is completely encapsulated by the copper coating 106. The copper coating 106 is applied on the bulk body 104 as a thin film of homogeneous thickness, d. The thickness, d, of the copper coating 106 is much lower than a thickness, D, of the bulk body 104. Preferably, a ratio between the thickness, d, of the coating 106 and the thickness, D, of the bulk body 104 is at least 0.0016. This ensures an improvement of the thermal and electric performance of the connection member 100 so that it becomes suitable for use in power semiconductor applications such as power packages. The mentioned ratio should at the same time be preferably not more than 0.4, because otherwise a plating procedure used for forming the coating 106 on the bulk body 104 would take too much time and would reduce the efficiency of the manufacturing procedure. An absolute value of the thickness, d, of the coating 106 may for instance be in a range between 4 μm and 100 μm, preferably in a range between 10 μm in 30 μm. For instance, the absolute value of the thickness, D, of the bulk body 104 may be 250 μm.

Hence, FIG. 1 shows a cross-section of a steel core leadframe as connection member 100 with copper metallization as coating 106. In the shown embodiment, the bulk body 104 made of steel is coated with the coating 106 in form of one layer of copper metallization with a certain thickness, d, to improve the electrical and thermal performance of a power package or other electronic component 114 in which the connection member 100 is implemented.

Besides steel bulk material with copper metallization, alternative materials for both the bulk material (for instance other metals or even non-conductive materials) and the metallization layer (for instance other metals) are also possible in other exemplary embodiments. Some examples are listed in Table 1.

TABLE 1

Overview of possible bulk materials and metallizations layer

|  | Bulk Material | Metallization Layer (s) |
| --- | --- | --- |
| Preferred | Iron, steel (iron-alloy), steel-alloys | Cu or Cu-alloys (for instance Cu-Zn, Cu-Sn) |
| Alternatives | Various types of steel, such as: a) Carbon Steels b) Alloy Steels c) Stainless Steels d) Tool Steels | Zinc and zinc-alloys |

FIG. 2 to FIG. 8 show cross-sectional views of connection members 100 according to exemplary embodiments in which a bulk body 104 of steel is coated with a copper coating 106 which is, in turn, coated by one or more further coating layers 108.

In particular, further coating of one or more metal layers on a copper-coated steel leadframe surface makes it possible to adjust the properties of the connection member 100 for a respective application. Examples for such applications are wire-bonding, die attach or adhesion purposes.

For example, various plating procedures can be applied on the top of a steel leadframe with copper metallization, as shown for instance in FIG. 1. The choice of one or more plating layers as further coating layers 108 depends on the assembly technology and materials used (for example die attach materials, wire bonding, mold compound, etc.) and also on an application of an electronic component 114 such as a package. As examples, FIG. 2 to FIG. 8 show some plating layers as further coating layers 108 which can be applied onto for instance a steel leadframe with a copper metallization. The thickness of at least one further coating layer 108 can follow a current thickness for a copper based leadframe.

Figure 2:
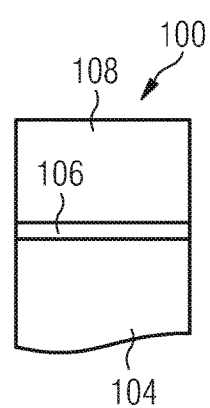
FIG. 2 to FIG. 8 show cross-sectional views of portions of connection members according to exemplary embodiments in which a bulk body of steel is coated with a copper coating which is, in turn, coated by one or more further coating layers.

Thus, as shown in each of FIG. 2 to FIG. 8, the connection member 100 may comprise one or more further coatings 108 on at least part of the coating 106. The further coating 108 and the coating 106 may be made of different materials to provide different functions. As can be taken from FIG. 2 to FIG. 7, the at least one further coating 108 may comprise one of Ag, Ni, Ni/NiP, Ni/NiP/Ag, Ni/Pd/Au—Ag, Ni/Pd/Au—Pd, Ni/Pd/Au, Sn, and Sn—Pb, depending on a desired application. The respective one or more further coatings 108 according to FIG. 2 to FIG. 7 are as follows:

Referring to FIG. 2, a single further layer is applied as a further coating 108 on an exterior surface of the coating 106 and is made of Ag so that the exterior surface of the connection member 100 of FIG. 2 is highly appropriate for wire bonding, and in particular for attaching gold or copper material.

Figure 3:
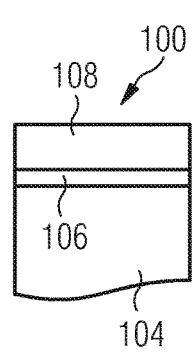

Referring to FIG. 3, a single further layer is applied as a further coating 108 on an exterior surface of the coating 106 and is made of Ni so that the exterior surface of the connection member 100 of FIG. 3 is highly appropriate for aluminum wire bonding.

Figure 4:
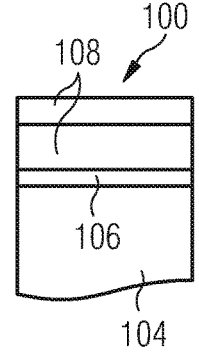

Referring to FIG. 4, a double layer is applied as further coating 108 on an exterior surface of the coating 106 and is made of a first layer of Ni and a second layer (as surface layer) of NiP. Also with this double layer, the exterior surface of the connection member 100 of FIG. 4 is highly appropriate for aluminum wire bonding.

Figure 5:
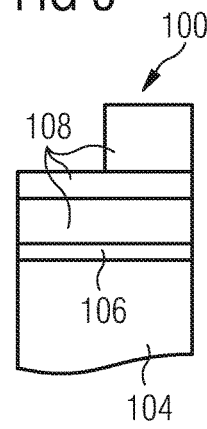

Referring to FIG. 5, a layer stack is applied as further coating 108 on an exterior surface of the coating 106 and is made of a first layer of Ni and a second layer (partially as surface layer) of NiP. Only a portion of the second layer of NiP is additionally covered with a third further layer (as surface layer), made of Ag. With this three layer stack of further coating 108, the exterior surface of the connection member 100 of FIG. 5 is highly appropriate for the purposes described above referring to FIG. 2 and FIG. 4.

Figure 6:
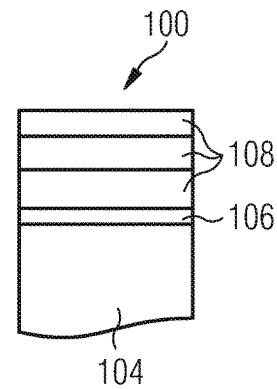
Figure 7:
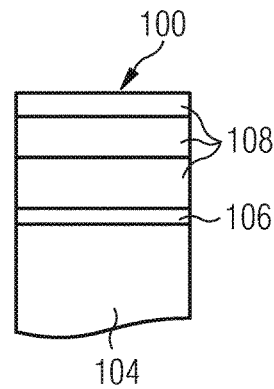

Referring to FIG. 6 and FIG. 7, a three layer stack is formed as further coating 108 on an exterior surface of coating 106. According to FIG. 6, the three layer stack is composed of Ni/Pd/Au—Ag or Ni/Pd/Au—Pd, whereas the three layer stack of FIG. 7 is composed of Ni/Pd/Au. With each of these three layers stacks, the exterior surface of the connection member 100 of FIG. 6 and FIG. 7 is highly appropriate for gold or copper wire bonding.

A further coating of metal layers on the external leads of a Cu-coated steel leadframe after molding and post-mold curing process (for solderability purpose) is possible as well. For the external leads after a molding and post-mold curing process, Sn or Sn/Pb plating can be applied at the external leads (see FIG. 8). The thickness of Sn or Sn/Pb can follow the same thickness used for a copper based leadframe. If a Ni/Pd/Au—Ag-plated or Ni/Pd/Au-plated stack is used for external leads during a leadframe plating process, it is optional to plate Sn or Sn/Pb after molding and post-mold curing process.

The further coatings 108 shown in FIG. 2 to FIG. 7 may all be located at least partially in the interior of an encapsulant (compare for example reference numeral 116 in FIG. 13) when a power package-type electronic component 114 is readily manufactured. In contrast to this, FIG. 8 described in the following in further detail illustrates a further coating 108 on coating 106 of a connection member 100, which further coating 108 is arranged (and preferably is applied) after encapsulation on a portion of connection member 100 extending beyond encapsulant 116 (compare FIG. 13).

Figure 8:
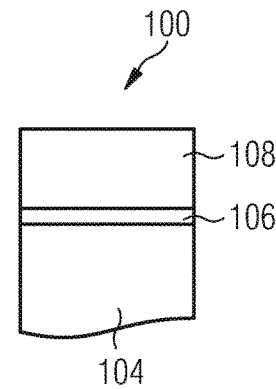

Referring to FIG. 8, the shown further coating 108 is applied on only a part of an exterior surface of coating 106 and comprises for instance Sn or SnPb. This further coating 108 may for instance be only formed on a portion of the connection member 100 extending beyond encapsulant 116. Only this portion of the connection member 100 is then to be connected by soldering, as promoted by the further coating 108 being made of a solderable material, with a mounting base such as a printed circuit board (compare reference numeral 118 in FIG. 13). Hence, the embodiment of FIG. 8 provides an Sn or SnPb-plated steel leadframe with Cu metallization (external leads).

Figure 9:
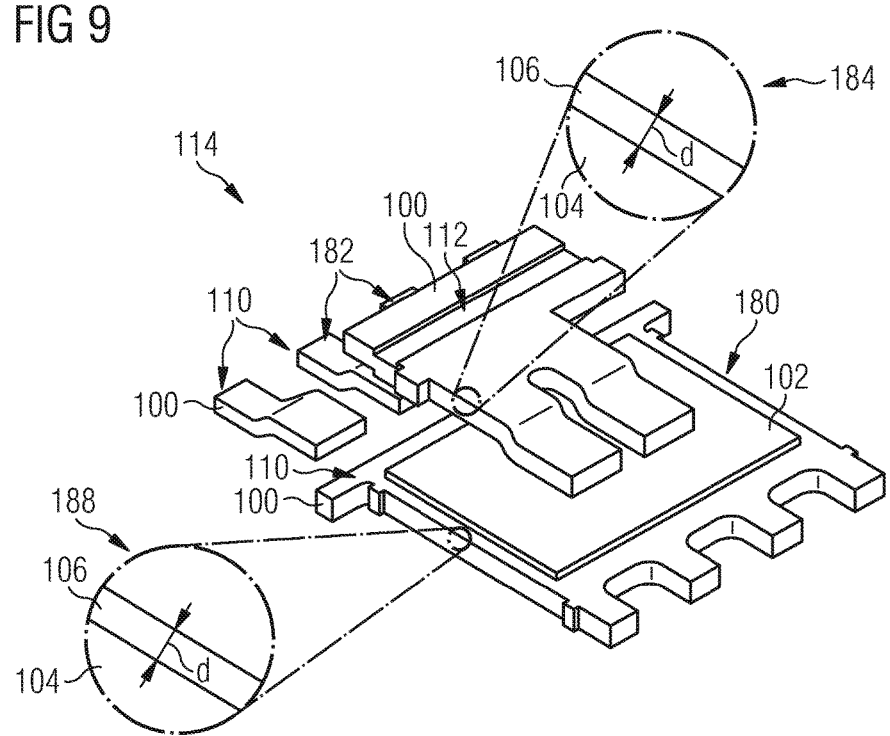
FIG. 9 illustrates a three-dimensional view of an electronic component according to an exemplary embodiment comprising a first leadframe-type connection member and a second clip-type connection member both electrically and mechanically connecting an electronic chip.
Figure 10:
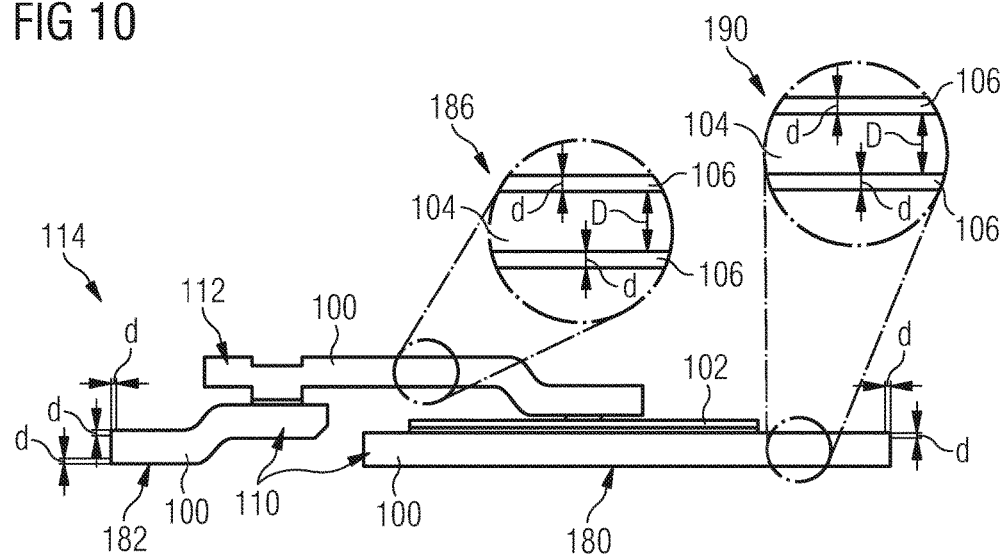
FIG. 10 illustrates a cross-sectional view of the electronic component according to FIG. 9.
Figure 11:
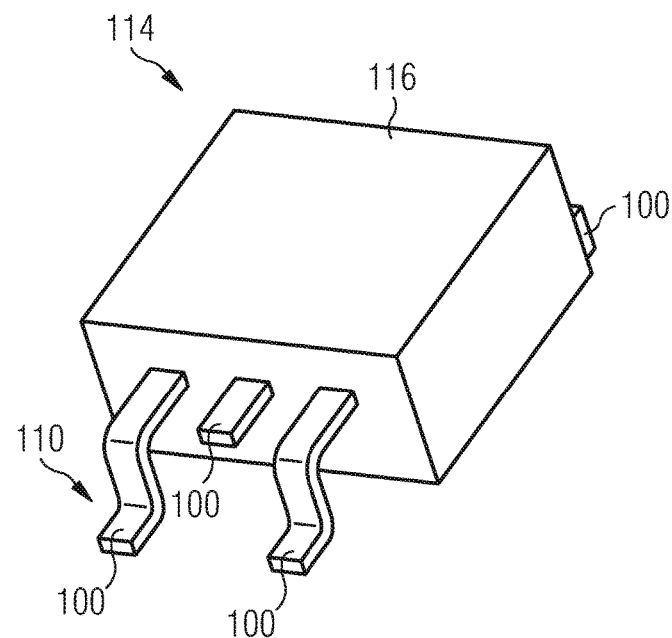
FIG. 11 illustrates a three-dimensional view of an encapsulated electronic component according to an exemplary embodiment.
Figure 12:
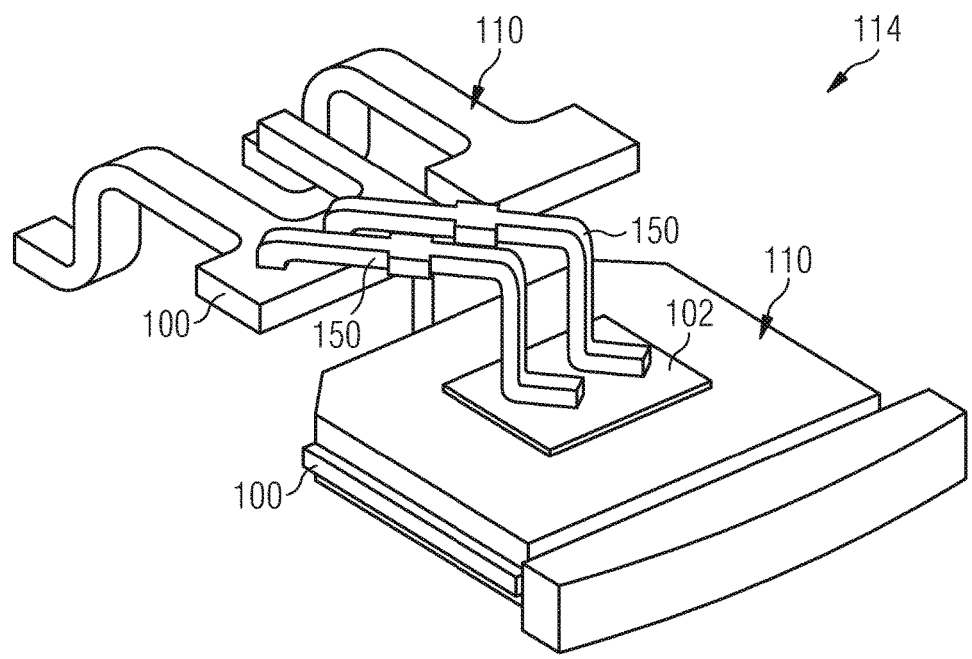
FIG. 12 illustrates a three dimensional view of the electronic component according to FIG. 11 without encapsulant.

FIG. 9 illustrates a three dimensional view of an electronic component 114 according to an exemplary embodiment comprising a first (here leadframe-type) connection member 100 (i.e. configured as leadframe 110) and a second (here clip-type) connection member 100 (i.e. configured as clip 112). Both connection members 100 electrically and mechanically connect an electronic chip 102 such as a semiconductor power chip. FIG. 10 illustrates a cross-sectional view of the electronic component 114 according to FIG. 9 embodied as power package.

Thus, the electronic component 114 shown in FIG. 9 and FIG. 10 comprises, as the first connection member 100, the leadframe 110 formed on the basis of a punched and bent planar metal sheet. The leadframe 110 comprises an iron comprising (for instance steel) bulk body 104 with thickness, D, of for instance 250 μm coated with coating 106 comprising copper and having a much smaller thickness, d, of for instance 10 μm. In the shown embodiment, the leadframe 110 comprises two different and separate sections, i.e. a mounting section 180 for mounting the electronic chip 102, and a pin section 182 comprising pins for an electric coupling with an electronic environment of the electronic component 114.

A lower main surface of the electronic chip 102 is mounted on the mounting section 180 of the leadframe 110 to thereby establish an electrically conductive and thermally conductive connection between the electronic chip 102 and the leadframe 110. For instance, the electronic chip 102 may be configured as a transistor chip having a transistor (in particular field effect transistor) monolithically integrated therein. For example, a drain pad of the electronic chip may be located on the lower main surface and may be coupled with the leadframe 110 by the described mounting.

As mentioned above, the electronic component 114 additionally comprises, as the second connection member 100, the clip 112 which may also be formed on the basis of a punched and bent planar metal sheet. The clip 112 comprises an iron comprising (for instance steel) bulk body 104 with thickness, D, of for instance 250 µm coated with coating 106 comprising copper and having a much smaller thickness, d, of for instance 10 µm.

An upper main surface of the electronic chip 102 is connected with one terminal of the clip 112 having another terminal being mounted on the pin section 182 of the leadframe 110. Thereby, a further electrically conductive and thermally conductive connection is established between the electronic chip 102 and the leadframe 110 via the clip 112. As mentioned above, the electronic chip 102 may be configured as a transistor chip having both a source pad and a gate pad located on the upper main surface thereof, both of which being coupled with the leadframe 110 via the clip 112. In the shown embodiment, the electronic chip 102 may be configured for an operation with a vertical current flow, i.e. along a vertical direction of FIG. 10.

A detail 184 in FIG. 9 and a detail 186 in FIG. 10 show the thermally conductive and electrically conductive coating 106 of the clip 112 improving the electric and thermal performance of the power package-type electronic component 114 with the power chip-type electronic chip 102 with vertical current flow. Correspondingly, a detail 188 in FIG. 9 and a detail 190 in FIG. 10 show the thermally conductive and electrically conductive coating 106 of the leadframe 110 also improving the electric and thermal performance of the electronic component 114 with the electronic chip 102. Thus, current flowing in the electronic component 114 may be conducted in a low ohmic way also by the connection members 100. Moreover, heat generated by electronic chip 102 during operation may be efficiently removed by the connection members 100 from the electronic component 114.

Two types of simulations have been carried out to show that exemplary embodiments improve both the electric and thermal performance of connection members 100 and corresponding electronic components 114:

To assess the electric performance of exemplary embodiments, package RDSon simulations and actual sample evaluations were conducted. RDSon hereby refers to the source to drain resistance of an electronic component 114 of the type shown in FIG. 9 and FIG. 10 when the device is on. The smaller the RDSon value, the better is the electric performance.

The simulation results are shown in Table 2. The thickness of clip materials and leadframe bulk material is the same, namely 250 µm. The scenarios use Cu materials for the clip, while they use Fe material or SPCE materials as leadframe bulk materials. SPCE is one type of steel material (SPCE=Steel Plate Cold deep drawn Extra non-ageing) which has been used for actual sample evaluations. For some of the scenarios, Fe is considered as bulk material with the thickness of Cu metallization of 1.5 µm, 7 µm and 20 µm, respectively. Similarly, for the other scenarios, SPCE is considered as bulk material with the thickness of Cu metallization of 1.5 µm, 7 µm and 20 µm, respectively.

Table 2 shows that package RDSon reduces as the thickness of Cu metallization increases. In particular the results obtained for scenarios 2, 3, 5 and 6 are within the specification of many package types. When the thickness of the coating 106 is at least 4 µm and/or the ratio between the thickness of the coating 106 and the thickness of the bulk body 104 is at least 1.6%, good results are obtained for many package types.

TABLE 2

Summary of simulation results vs. actual sample experiments

| Scenario | 1 | 2 | 3 | 4 | 5 | 6 |
|---|---|---|---|---|---|---|
| Leadframe | Fe 250 µm with 1.5 µm Cu | Fe 250 µm with 7 µm Cu | Fe 250 µm with 20 µm Cu | SPCE 250 µm with 1.5 µm Cu | SPCE 250 µm with 7 µm Cu | SPCE 250 µm with 20 µm Cu |
| Clip | Cu 250 µm | Cu 250 µm | Cu 250 µm | Cu 250 µm | Cu 250 µm | Cu 250 µm |
| Total RDSONon (mΩ) | 1.660 | 1.598 | 1.534 | 1.735 | 1.638 | 1.550 |
| Measured Ron range from experiments (mΩ) | | | | 1.55-2.0 | | |

Hence, the RDSon simulation for TDSON 8 shows that, as the copper thickness increases, the RDSon decreases.

Moreover, thermal simulations have been performed using a TO263 package. Such a package or electronic component 114 is shown with encapsulant 116 in FIG. 11 and without encapsulant 116 in FIG. 12. It turned out that proper small thermal resistance (Rth) values can be obtained by exemplary embodiments. More specifically, Rth simulations have been conducted for 10263 package. The chip size has been 3.8×2.6 mm$^2$ and the chip thickness is 70 µm. The simulation results are shown in Table 3.

TABLE 3

Summary of Rth simulation results (Rth relates to the bottom of the package fixed to 85° C.)

| Scenario | 1 | 2 | 3 | 4 | 5 | 6 |
|---|---|---|---|---|---|---|
| Leadframe | Fe 1270/500 µm with 1.5 µm Cu | Fe 1270/500 µm with 7 µm Cu | Fe 1270/500 µm with 20 µm Cu | SPCE 1270/500 µm with 1.5 µm Cu | SPCE 1270/500 µm with 7 µm Cu | SPCE 1270/500 µm with 20 µm Cu |
| Rth [K/W] | 1.346 | 1.329 | 1.292 | 1.716 | 1.687 | 1.624 |

The thickness of leadframe bulk material is the same. The various scenarios use Fe material or SPCE materials as leadframe bulk materials. For other scenarios, Fe is considered as bulk material with the thickness of Cu metallization of 1.5 µm, 7 µm and 20 µm, respectively. Similarly, for the other scenarios, SPCE is considered as bulk material with the thickness of Cu metallization of 1.5 µm, 7 µm and 20 µm, respectively.

The values in Table 3 show that, in particular with a sufficiently high thickness of the coating 104, the obtainable thermal resistance is compatible with specifications of many package types. In particular, the Rth simulation for TO 263-3 shows that as Cu thickness increases, the Rth of the electronic component 114 is advantageously reduced. A corresponding concept can also be applied to other power packages/devices, such as TO, TPAK, etc. This means that it is possible to use in particular a steel leadframe with Cu metallization to reduce the manufacturing effort while at the same time meeting the specification of many package types.

Figure 13:
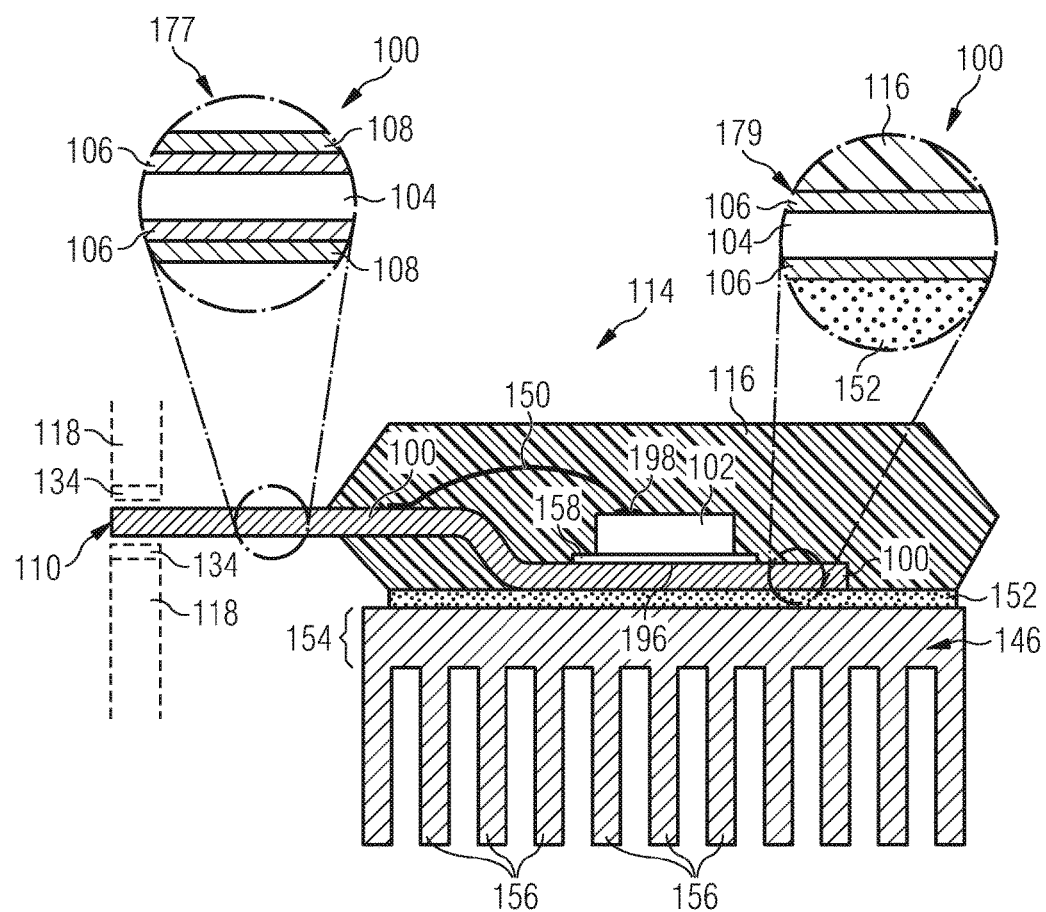
FIG. 13 illustrates a cross-sectional view of an electronic component according to an exemplary embodiment.

FIG. 13 illustrates a cross-sectional view of an electronic component 114 configured as an encapsulated electronic chip 102 on a leadframe 110 as chip carrier according to an exemplary embodiment. More specifically, FIG. 13 illustrates a cross-sectional view of an electronic component 114, which is embodied as a Transistor Outline (TO) package, according to an exemplary embodiment of the invention. The electronic component 114 is mounted on a mounting base 118, here embodied as printed circuit board.

The mounting base 118 comprises an electric contact 134 embodied as a plating in a through hole of the mounting base 118. When the electronic component 114 is mounted on the mounting base 118, electronic chip 102 of the electronic component 114 is electrically connected to the electric contact 134 via the leadframe 110 of the electronic component 114.

The electronic component 114 comprises an electrically conductive connection member 100 (here embodied as leadframe 110), the electronic chip 102 (which is here embodied as a power semiconductor chip) adhesively or by soldering mounted on the connection member 100 (see solder structure 158), and encapsulant 116 (here embodied as mold compound) encapsulating part of the connection member 100 and part of the electronic chip 102. As can be taken from FIG. 13, a pad on an upper main surface of the electronic chip 102 is electrically coupled to the connection member 100 via a bond wire 150. Chip pads 196, 198 are provided on a lower and on an upper main surface of electronic chip 102.

During operation of the power package or electronic component 114, the power semiconductor chip in form of the electronic chip 102 generates a considerable amount of heat. At the same time, it should be ensured that any undesired current flow between a bottom surface of the electronic component 100 and an environment is reliably avoided.

For ensuring electrical insulation of the electronic chip 102 and removing heat from an interior of the electronic chip 102 towards an environment, an electrically insulating and thermally conductive interface structure 152 may be optionally provided which covers an exposed surface portion of the connection member 100 and a connected surface portion of the encapsulant 116 at the bottom of the electronic component 114. The electrically insulating property of the interface structure 152 prevents undesired current flow even in the presence of high voltages between an interior and an exterior of the electronic component 114. The thermally conductive property of the interface structure 152 promotes a removal of heat from the electronic chip 102, via the electrically conductive connection member 100 (of thermally properly conductive copper), through the interface structure 152 and towards a heat dissipation body 146. The heat dissipation body 146, which may be made of a highly thermally conductive material such as copper or aluminum, has a base body 154 directly connected to the interface structure 152 and has a plurality of cooling fins 156 extending from the base body 154 and in parallel to one another so as to remove the heat towards the environment.

As can be taken from a detail 177, a portion of the leadframe 110 extending beyond the encapsulant 116 comprises copper coating 106 on steel bulk body 104 and a further coating 108 on the coating 106. The further coating 108 may for example be made of tin. This further coating 108 is not formed on another portion of the leadframe 110 being encapsulated by the encapsulant 116 (see detail 179). The solderable material of the further coating 108 allows the formation of a solder connection between the leadframe 110 and the mounting base 118. The continuous coating 106 increases the electric and thermal performance of the electronic component 114, while the spatially selectively applied further coating 108 simultaneously promotes a reliable solder connection with the mounting base 118.

According to FIG. 13, the electronic chip 102 may be coupled with the leadframe 110 by mounting the electronic chip 102 on the leadframe 110 with a solder connection between the electronic chip 102 and the leadframe 110.

With the migrating of bonding wires from gold to copper wire in recent years, leadframe materials become one of most costly materials in the package assembly. Thus, a reduction of the effort in terms of manufacturing of a leadframe becomes more and more important.

In order to reduce the effort for leadframe manufacture, leadframe materials may be changed. Also the manufacture of high density leadframes (such as larger strip size, etc.) is an option. It is also possible to convert an etched leadframe to a stamped leadframe for high volume parts. However, such concepts result only in a moderate reduction of the effort of manufacturing leadframes.

Exemplary embodiments implement bulk leadframe materials on the basis of iron, in particular steel and improve thermal and electric performance by an appropriate coating.

Steel can be obtained and processed with reasonable effort but involves the challenge of a lower electrical and thermal conductivity compared with copper material. In order to overcome this shortcoming, an exemplary embodiment provides a connection member such as a leadframe including an iron comprising bulk body with a coating or metallization (for instance manufactured by plating or by other methods). The coating may be made of a material which properly adheres on the iron comprising bulk body and at the same time increases the thermal and electrical conductivity of the manufactured connection member as a whole. The coating, which is preferably made of or comprises copper, may be applied directly onto a steel-based leadframe surface to improve the electrical and thermal performance of the leadframe. A correspondingly manufactured connection member can therefore be used also for power packages as well as other integrated circuit (IC) packages as examples of electronic components of exemplary embodiments.

Table 4 shows a comparison of electrical conductivity and thermal conductivity for copper and steel materials.

TABLE 4

Electrical conductivity and thermal conductivity at 20° C.

| Base Material | Electrical conductivity [S/m] | Thermal conductivity [W / (m * K)] |
|---|---|---|
| Pure Cu | $5.8 \times 10^7$ | 385~401 |
| Pure Fe | $1.03 \times 10^7$ | 72.7~79.5 |
| Stainless steel | $1.1 \times 10^6$ | 16.3~24 |
| Carbon Steel | $6.99 \times 10^6$ | 36~54 |
| Zinc | $1.69 \times 10^7$ | 116 |

As seen in Table 4, the electrical conductivity of steel is about 50 times lower than that of copper material. The thermal conductivity of steel is about 5 to 10 times lower than that of copper material. In order to improve both electrical and thermal conductivity of a steel-based leadframe for power package application, a copper metallization may be applied onto the steel-based leadframe surface in an exemplary embodiment.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A connection member for connecting an electronic chip, wherein the connection member comprises:
   a bulk body;
   a coating at least partially coating the bulk body and comprising a material having higher electric conductivity and higher thermal conductivity than the bulk body;
   wherein a ratio between a thickness of the coating and a thickness of the bulk body is at least 0.0016 at or over at least a part of the connection member;
   wherein the coating comprises or consists of at least one of the group consisting of copper, a copper alloy, zinc, and zinc alloy, wherein the bulk body consists of iron.

2. The connection member according to claim 1, wherein at least a portion of the coating has a thickness in a range between 4 μm and 100 μm.

3. The connection member according to claim 1, wherein the coating has a thickness of at least 7 μm.

4. The connection member according to claim 1, configured as a leadframe.

5. The connection member according to claim 1, configured as a clip.

6. The connection member according to claim 1, wherein a thickness of the bulk body is in a range between 100 μm and 2500 μm.

7. The connection member according to claim 1, wherein the bulk body comprises or consists of one of an iron alloy, a steel alloy, and steel.

8. The connection member according to claim 1, comprising at least one further coating on at least part of the coating, wherein the further coating and the coating are made of different materials.

9. The connection member according to claim 8, wherein the at least one further coating comprises at least one of the group consisting of Ag, Ni, Ni/NiP, Ni/NiP/Ag, Ni/Pd/Au—Ag, Ni/Pd/Au—Pd, Ni/Pd/Au, Sn, and Sn—Pb.

10. The connection member according to claim 1, wherein the coating is applied directly on the bulk body.

11. The connection member according to claim 1, wherein the coating coats the entire surface of the bulk body.

12. A method of manufacturing a connection member for connecting an electronic chip, wherein the method comprises:
   providing a bulk body comprising iron;
   at least partially coating the bulk body by a coating;
   forming at least a portion of the coating with a thickness between 4 μm and 100 μm, wherein the coating comprises a material having higher electric conductivity and higher thermal conductivity than the bulk body and the coating comprises or consists of at least one of the group consisting of copper, a copper alloy, zinc, and zinc alloy;
   forming the connection member with a ratio between a thickness of the coating and a thickness of the bulk body of at least 0.0016 at or over at least a part of the connection member, wherein the bulk body consists of iron.

13. The method according to claim 12, wherein forming the coating comprises at least one of the group consisting of plating, physical vapor deposition, chemical vapor deposition, rolling at least one copper comprising sheet onto the bulk body, and sputtering.

14. An electronic component, wherein the electronic component comprises:
   a leadframe comprising a non-copper bulk body at least partially coated with a coating comprising copper, the coating having a thickness of more than 4 μm;
   an electronic chip coupled with the leadframe; and
   an encapsulant encapsulating part of the leadframe and the electronic chip;
   wherein a portion of the leadframe extending beyond the encapsulant comprises a further coating on the coating, wherein this further coating is not formed on another portion of the leadframe being encapsulated by the encapsulant.

15. The electronic component according to claim 14, wherein at least part of the coating is coated by a further coating.

16. The electronic component according to claim 14, configured as a power package.

17. The electronic component according to claim 14, wherein the electronic chip is a power semiconductor chip.

18. The electronic component according to claim 14, wherein the electronic chip is configured for an operation with a vertical current flow.

19. A method of manufacturing an electronic component, wherein the method comprises:
   providing a leadframe with a non-copper bulk body at least partially coated with a coating, the coating having a thickness of more than 4 μm, the coating comprising a material having higher electric conductivity and higher thermal conductivity than the bulk body, and the coating comprises or consists of at least one of the group consisting of copper, a copper alloy, zinc, and zinc alloy, wherein a ratio between a thickness of the coating and a thickness of the bulk body is at least 0.0016 at or over at least a part of the bulk body; and
   coupling an electronic chip with the leadframe, wherein the bulk body consists of iron.

20. The method according to claim 19, wherein coupling the electronic chip with the leadframe comprises mounting the electronic chip on the leadframe.

\* \* \* \* \*